US008677051B2

(12) United States Patent
Tanaka et al.

(10) Patent No.: US 8,677,051 B2
(45) Date of Patent: Mar. 18, 2014

(54) MEMORY SYSTEM, CONTROL METHOD THEREOF, AND INFORMATION PROCESSING APPARATUS

(75) Inventors: Hiroaki Tanaka, Kanagawa (JP); Hirokazu Morita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 276 days.

(21) Appl. No.: 13/072,208

(22) Filed: Mar. 25, 2011

(65) Prior Publication Data

US 2011/0258367 A1 Oct. 20, 2011

(30) Foreign Application Priority Data

Apr. 19, 2010 (JP) ................................ 2010-096172

(51) Int. Cl.
*G06F 12/00* (2006.01)
(52) U.S. Cl.
USPC ............... 711/5; 711/100; 711/150; 711/154; 711/163; 711/168
(58) Field of Classification Search
USPC ....................... 711/5, 100, 150, 154, 163, 168
See application file for complete search history.

(56) References Cited

U.S. PATENT DOCUMENTS

| 7,383,375 | B2 | 6/2008 | Sinclair |
| 8,335,123 | B2 | 12/2012 | Sprouse |
| 8,495,402 | B2 | 7/2013 | Byom et al. |
| 2007/0180216 | A1* | 8/2007 | Brown ........................... 711/202 |
| 2010/0318821 | A1* | 12/2010 | Kwan et al. ................... 713/320 |

FOREIGN PATENT DOCUMENTS

| JP | 7-200181 A | 8/1995 |
| JP | 2001-125749 A | 5/2001 |
| JP | 2001-344875 A | 12/2001 |
| JP | 2004-310651 A | 11/2004 |
| JP | 2007-517325 A | 6/2007 |
| JP | 2009-87282 A | 4/2009 |

OTHER PUBLICATIONS

Curtis E. Stevens, "Information Technology—ATA/ATAPI Command Set-2 (ACS-2)", Working Draft Project American National Standard, T13/2015-D, Revision 2, Aug. 3, 2009, 3 Pages.

* cited by examiner

*Primary Examiner* — Midys Rojas
(74) *Attorney, Agent, or Firm* — Oblon, Spivak, McClelland, Maier & Neustadt, L.L.P.

(57) ABSTRACT

According to the embodiment, a nonvolatile semiconductor memory that includes a plurality of banks capable of operating in parallel, a command analyzing unit that, upon receiving a power management command from a host, analyzes the received power management command, and a recording control unit that dynamically and variably controls an upper limit of the number of banks to be operated in parallel at a time of writing in accordance with an analysis result by the command analyzing unit are included, thereby suppressing the upper limit of a power consumption in accordance with an instruction from the host.

20 Claims, 15 Drawing Sheets

MEMORY SYSTEM, CONTROL METHOD THEREOF, AND INFORMATION PROCESSING APPARATUS

CROSS-REFERENCE TO RELATED APPLICATIONS

This application is based upon and claims the benefit of priority from the prior Japanese Patent Application No. 2010-96172, filed on Apr. 19, 2010; the entire contents of which are incorporated herein by reference.

FIELD

Embodiments described herein relate generally to a memory system that includes a nonvolatile semiconductor memory, a control method thereof, and an information processing apparatus.

BACKGROUND

A memory system including a NAND-type flash memory drives a plurality of chips in parallel to improve a transfer performance. In Japanese National Publication of International Patent Application No. 2007-517325, a concept of a virtual block in which a plurality of physical blocks is combined is introduced and writing is performed in parallel in units of virtual blocks.

DETAILED DESCRIPTION

According to embodiments, a nonvolatile semiconductor memory includes a plurality of banks capable of operating in parallel. A command analyzing unit, upon receiving a power management command from a host apparatus, analyzes the received power management command. A recording control unit dynamically and variably controls an upper limit of the number of banks to be operated in parallel at a time of writing in accordance with an analysis result by the command analyzing unit.

A memory system, a control method thereof, and an information processing apparatus according to embodiments are explained below in detail with reference to the accompanying drawings. The present invention is not limited to these embodiments.

An SSD (Solid State Drive) functions as an external memory of a host apparatus. When the host apparatus is a mobile apparatus, such as a laptop computer, there is a limit on power supply for long-term use in a mobile environment. Therefore, particularly, when the SSD is mounted on a mobile apparatus, it is desirable that the power consumption can be controlled in accordance with a request from the host.

In the SSD in the present embodiment, a bank parallelism is dynamically changed in accordance with a power management command from the host, thereby enabling to control the power consumption.

(First Embodiment)

Figure 1:
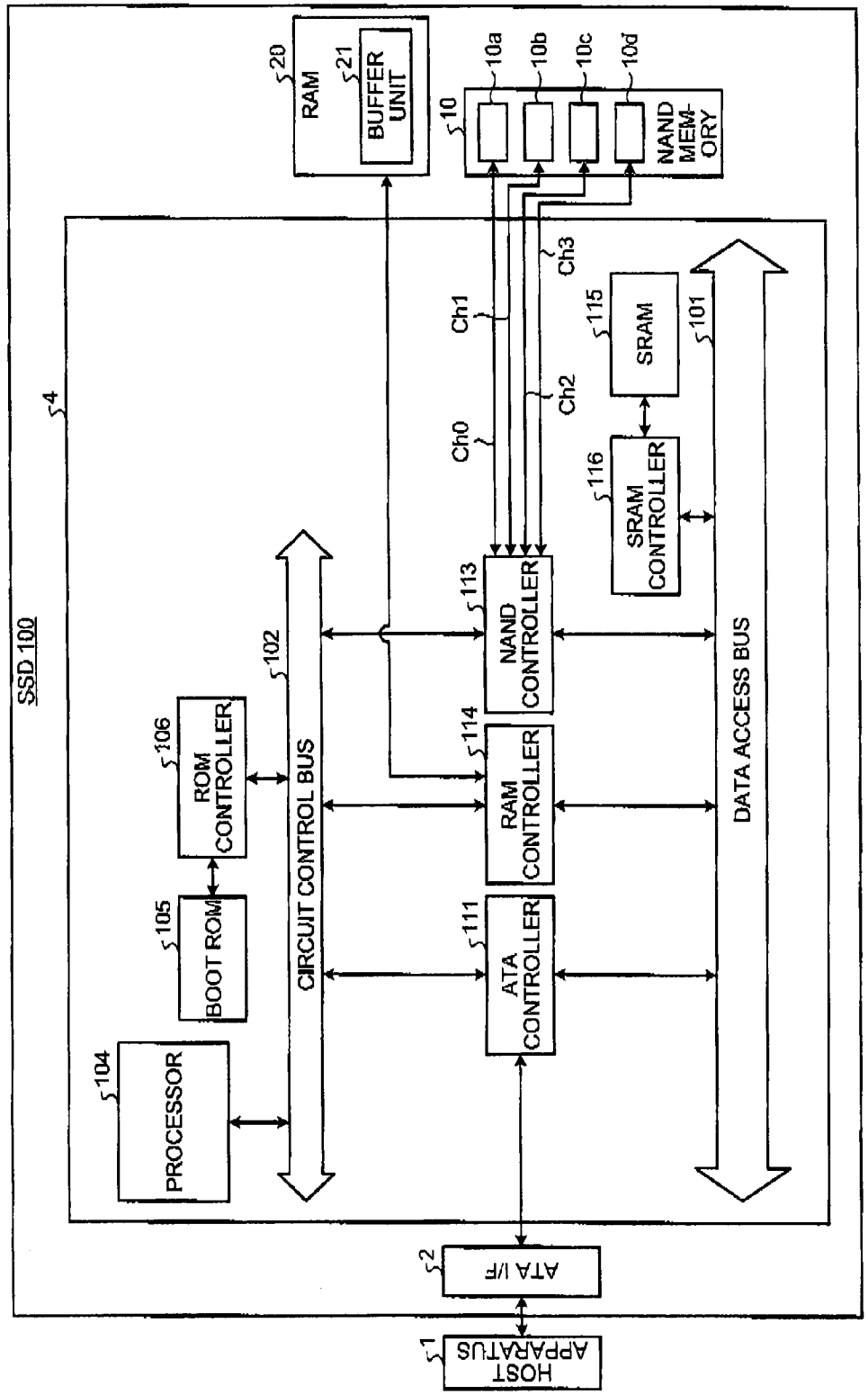
FIG. 1 is a block diagram illustrating a configuration example of an SSD.

FIG. 1 is a block diagram illustrating a configuration example of an SSD 100 as an example of the memory system. The SSD 100 includes a drive control circuit 4 as an SSD controller, a NAND-type flash memory (hereinafter, NAND memory) 10 as a nonvolatile semiconductor memory, a random access memory (RAM) 20 that includes, for example, a volatile semiconductor memory and functions as a buffer memory, a work memory area, or the like, a memory connection interface such as an advanced technology attachment interface (ATA I/F) 2, and the like. The SSD 100 is connected to a host apparatus (hereinafter, host) 1 such as a personal computer (PC) or a central processing unit (CPU) core via the ATA I/F 2 and functions as an external memory of the host 1.

The NAND memory 10 stores therein user data specified by the host 1 and management information managed in the RAM 20 for backup. The NAND memory 10 includes a memory cell array in which a plurality of memory cells is arrayed in a matrix manner and each memory cell is capable of multi-value recording by using an upper page and a lower page. The NAND memory 10 includes a plurality of memory chips and each memory chip is configured by arraying a plurality of physical blocks as a unit of data erasing. In the NAND memory 10, writing and reading of data is performed in physical page units. A physical block includes a plurality of physical pages. In FIG. 1, the NAND memory 10 is connected to a NAND controller 113 in the drive control circuit 4 via four channels (4ch: ch0 to ch3) in parallel and therefore can cause four channel parallel operation elements 10a to 10d to operate in parallel. The number of channels is not limited to four and any number can be employed for the number of channels.

The RAM 20 is used as a storing unit for data transfer, management information recording, or a work area. Specifically, a buffer unit 21 as the storing unit for data transfer is used for temporarily storing data, which is requested from the host 1 to write, before writing the data in the NAND memory 10 or used for temporarily storing data that is requested from the host 1 to read out and is read out from the NAND memory 10. As the storing unit for management information recording, the RAM 20 is used for storing management information for managing a storage location of data stored in the NAND memory 10 and the like (management tables obtained by loading various management tables stored in the NAND memory 10 at the time of start-up, a log as change difference information of the management tables, and the like).

The drive control circuit 4 performs data transfer control between the host 1 and the NAND memory 10 via the RAM 20 and controls the components in the SSD 100.

The drive control circuit 4 includes a data access bus 101 and a circuit control bus 102. A processor 104 that controls the entire drive control circuit 4 is connected to the circuit control bus 102. A boot ROM 105, in which a boot program for booting respective management programs (FW: firmware) stored in the NAND memory 10 is stored, is connected to the circuit control bus 102 via a ROM controller 106.

An ATA interface controller (an ATA controller) 111, the NAND controller 113, and a RAM controller 114 are connected to both the data access bus 101 and the circuit control bus 102. The ATA controller 111 as a communication control unit transmits and receives commands (write, read, flush, and the like), data, and the like to and from the host 1 via the ATA interface 2. A static random access memory (SRAM) 115 used as a data work area and a firmware loading area is connected to the data access bus 101 via an SRAM controller 116. The firmware stored in the NAND memory 10 is transferred to the SRAM 115 by the boot program stored in the boot ROM 105 at the time of start-up.

The RAM controller 114 performs interface processing between the processor 104 and the RAM 20 and the like. The NAND controller 113 performs interface processing between the processor 104 and the NAND memory 10, data transfer control between the NAND memory 10 and the RAM 20, encode/decode processing for an error correction code, and the like.

Figure 2:
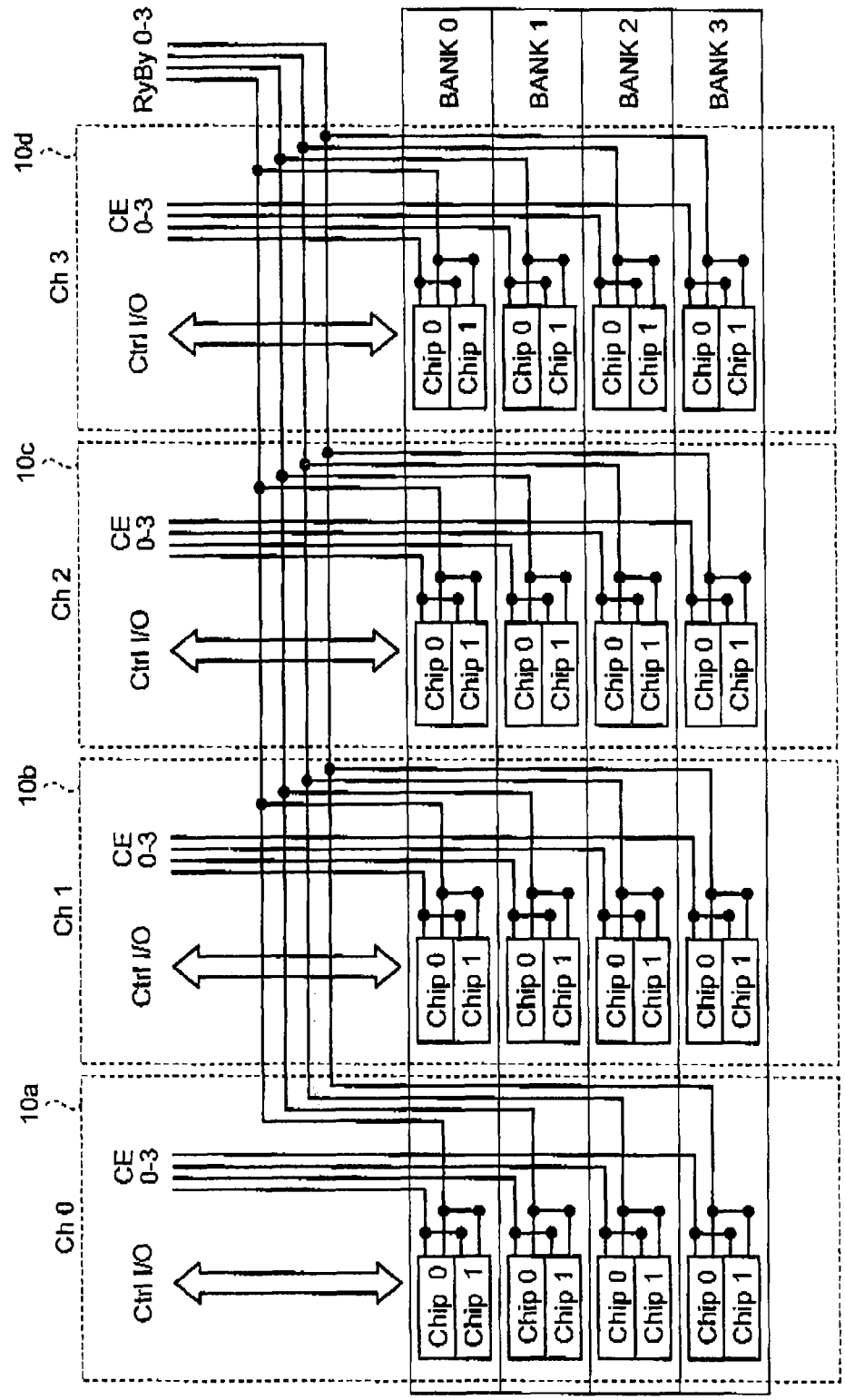
FIG. 2 is a diagram illustrating a connection form between a NAND controller and a NAND memory.

FIG. 2 illustrates a connection form between the NAND controller 113 and the NAND memory 10. As explained above, the NAND memory 10 includes the channel parallel operation elements 10a to 10d. Each of the channel parallel operation elements 10a to 10d includes a plurality of banks (in FIG. 2, four banks Bank0 to Bank3) capable of performing bank interleave. Each bank in each of the channel parallel operation elements 10a to 10d includes a plurality of memory chips (in FIG. 2, two memory chips Chip0 and Chip1).

As shown in FIG. 2, the NAND controller 113 includes a plurality of channels. In each channel, the NAND controller 113 controls the memory chips that share a control I/O signal (Ctrl I/O) for each bank with four chip enable signals (CE). The NAND controller 113 shares four ready/busy signals (RyBy) over the channels and performs control such that the memory chips of each channel that share the ready/busy signal (RyBy) operate simultaneously, A group of memory chips that share the ready/busy signal (RyBy) is referred to as a bank. Each bank can independently perform writing, reading, and erasing operations.

Figure 3:
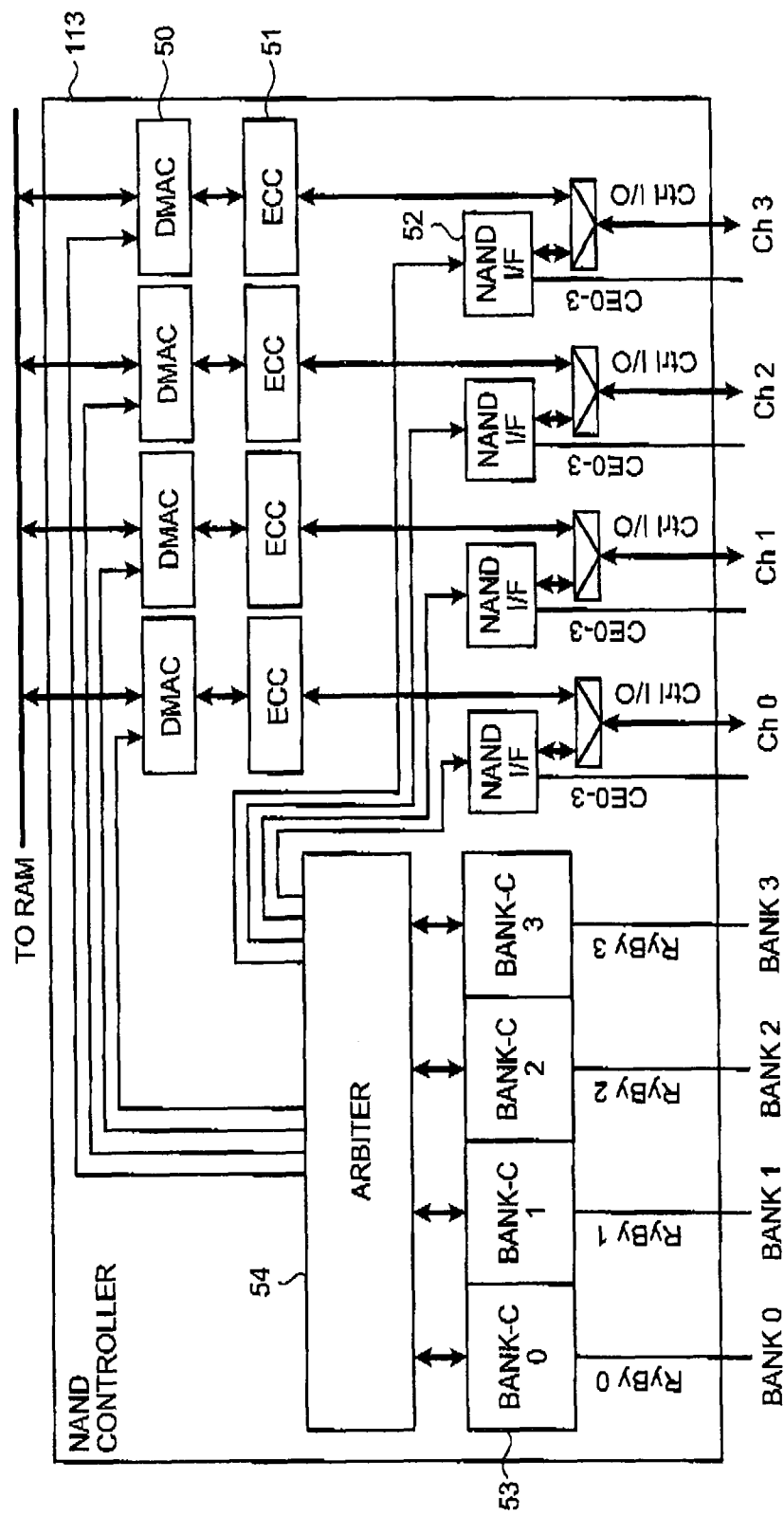
FIG. 3 is a block diagram illustrating an internal configuration example of the NAND controller.

FIG. 3 illustrates an internal configuration example of the NAND controller 113. To cause each channel to operate independently, the NAND controller 113 includes, for the respective channels, DMA controllers (DMACs) 50, error correction circuits (ECCs) 51, and NAND interfaces (NAND I/Fs) 52 that issue a command. Chip enable signals CE (CE0 to CE3) for four banks are connected to each of the NAND I/Fs 52. The NAND controller 113 controls the CE signals (CE0 to CE3) according to a bank to be accessed. To cause each of the four banks to operate independently, the NAND controller 113 includes four bank controllers (BANK-Cs) 53 that monitor the RyBy signals connected in common to each of the banks and manage states of the banks. The BANK-C 53 has a function of queuing requests to a corresponding bank. When there is a request to a bank, the BANK-C 53 secures a right of use in the channel and performs reading, writing, and erasing requests to the bank managed by the BANK-C 53. An arbitration control circuit 54 monitors the NAND I/Fs 52 and the BANK-Cs 53 and arbitrates channel use rights of the banks in accordance with a predetermined rule.

As described above, the NAND memory includes a plurality of banks. The NAND memory 10 can perform writing/reading in page units. In the followings, in order to simplify the explanation, writing (recording) is performed in block units for convenience' sake. Although it is possible to form a virtual block by combining physical blocks in each of the parallel operation elements 10a to 10d in the NAND memory 10, in the following, the NAND memory 10 includes only one channel (parallel operation element) and the parallel operation in the NAND memory 10 is performed only in bank units (interleave operation) for simplifying the explanation.

According to the above premise, each bank includes a plurality of physical blocks (hereinafter, simply "blocks" in some cases). The physical block is a unit (recording unit) of writing in one recording. As described above, in the bank interleave, even before finishing recording to a block belonging to a bank, it is possible to start writing to a block belonging to a different bank. However, writing cannot be performed on a block belonging to the bank to which a block during writing belongs until the last writing is finished. In the following explanation, in the SSD 100, the number of banks is M, and the upper limit of the number of banks capable of the parallel operation (interleave) as a circuit is N. In the present embodiment, for example, M=8 and N=4; however, typically, the values of M and N are arbitrary so long as the relation of M≥N is satisfied.

Moreover, in the first embodiment, an address PA of a physical block that actually needs to store a logical block address Addr used in the host 1 needs to be selected from physical blocks belonging to a bank determined for each logical block address Addr. As an example of such relationship, the following equation (1) can be given.

$$\text{Addr}\%M=\text{PA}\%M=\text{bank number (\#B)} \qquad (1)$$

An expression X % Y is calculation for obtaining a remainder of X/Y. In the first embodiment, PA corresponding to Addr is selected to satisfy the relationship of equation (1). For example, in the case where M=8, when PA=0, #B=0, when PA=1, #B=1, when PA=2, #B=2, ..., when PA=7, #B=7, and when PA=8, #B=0. Moreover, in the case where M=8, when Addr=0, #B=0, when Addr=1, #B=1, when Addr=2, #B=2, ..., when Addr=7, #B=7, and when Addr=8, #B=0.

Figure 4:
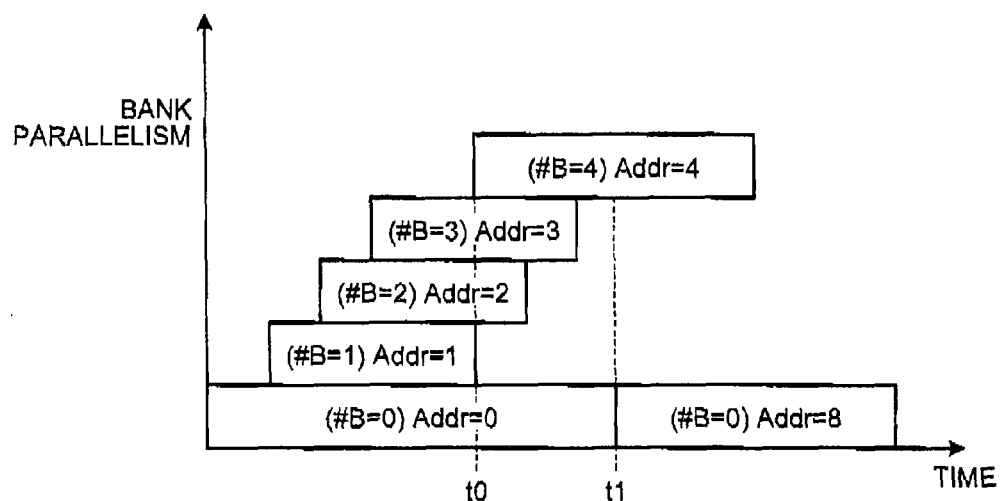
FIG. 4 is a diagram explaining a bank interleave operation.

FIG. 4 is a diagram illustrating the bank interleave operation by the SSD 100 when write data by sequential writing having Addr=0, 1, 2, 3, and 4 is sequentially input from the host 1. Based on equation (1), data of Addr=0 is written in the bank of #B=0, data of Addr=1 is written in the bank of #B=1, data of Addr=2 is written in the bank of #B=2, data of Addr=3 is written in the bank of #B=3, and data of Addr=4 is written in the bank of #B=4. The maximum number of banks N capable of a simultaneous parallel operation is four. Therefore, although, as shown in FIG. 4, the interleave operation is first performed on four banks of #B=0, #B=1, #B=2, and #B=3, the write operation to the next bank #B=4 is not performed until the write operation to any of the four banks is finished. In FIG. 4, the write operation to the bank of #B=1 is first finished at a time point t0, so that the write operation to the next bank #B=4 is performed at the time point t0. In this manner, the interleave operation, in which the maximum number of banks N capable of the simultaneous parallel operation is suppressed to four, is performed. When writing of data having Addr=00, 1, 2, 3, and 8 is performed, data of Addr=8 can be written only in the bank of #B=0, so that if writing of data of Addr=00 in the bank of #B=0 is not finished at a time point of t1, writing of the data of Addr=8 cannot be performed.

When write data by random writing having Addr=0, 3, 5, and 7 is sequentially input from the host 1, four banks of #B=0, #B=3, #B=5, and #B=7 are selected out of eight banks and the interleave operation is performed on the selected four banks.

In the following explanation, the functional configuration of the buffer unit 21 in the RAM 20 is simplified, and the buffer unit 21 has a ring-buffer-like configuration in which data is written in block units and the data is read out in block units.

Figure 5:
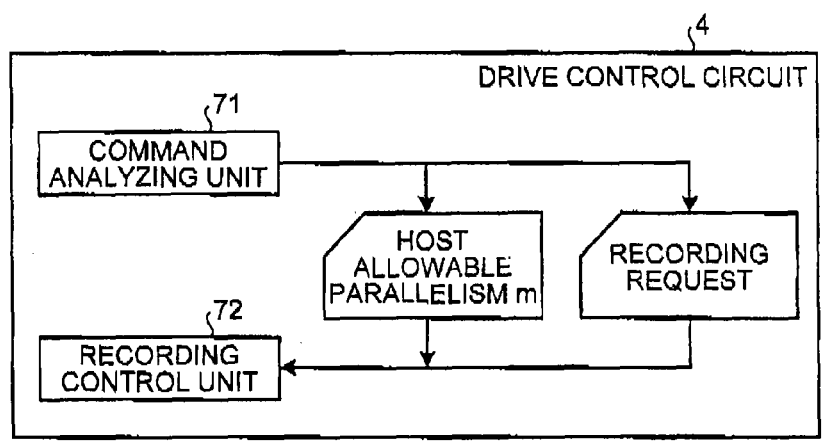
FIG. 5 is a block diagram illustrating an internal configuration example of a drive control circuit.

FIG. 5 is a diagram illustrating a functional configuration of an essential part of the present embodiment in the configuration in the drive control circuit 4. The drive control circuit 4 includes a command analyzing unit 71 that analyzes an ATA command from the host 1, and a recording control unit 72 that performs write/read control to the buffer unit 21 and write control to the NAND memory 10. The main functions of the command analyzing unit 71 are realized by the above-described firmware that causes the processor 104 to operate. The command analyzing unit 71 analyzes the ATA command from the host 1 and updates a host allowable parallelism m as management information (internal variable) that is the analysis result. The recording control unit 72 refers to the host allowable parallelism m and determines the upper limit (≤N) of the bank parallelism when writing to the NAND memory 10 based on the host allowable parallelism m. Moreover, a recording request (including the logical block address Addr, a buffer position Bufp, and the number of recording blocks Size) as a command analysis result is output from the command analyzing unit 71 to the recording control unit 72. The main functions of the recording control unit 72 are realized by the above-described firmware that causes the processor 104 to operate, the RAM controller 114, and the NAND controller 113.

Figure 6:
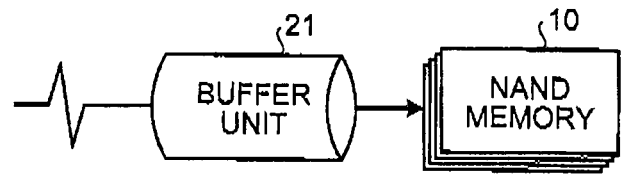
FIG. 6 is a diagram schematically illustrating a write operation.

FIG. 6 illustrates write processing of data received from the host 1. The data received from the host 1 is once buffered in the buffer unit 21 and is then written in the NAND memory 10.

Explanation is given for a power management command (for example, "Enable/Disable the APM feature set" of "SET FEATURES" in ATA command system) transmitted from the host 1. The "APM feature set" is shown below. The correspondence between the power consumption and the performance is specified based on a count value.

| value (count) | comment |
|---|---|
| (a) 00h | reserved, disabled |
| (b) 01h | minimum power consumption/with standby |
| (c) 02h-7Fh | intermediate power consumption/with standby |
| (d) 80h | minimum power consumption/without standby |
| (e) 81h-FDh | intermediate power consumption/without standby |
| (f) FEh | maximum performance |
| (g) FFh | reserved, disabled |

In the present embodiment, for responding to the power management command of the ATA, when the count value is "01h" and "80h", the upper limit of the number of banks that are driven simultaneously in parallel is set to one by setting the host allowable parallelism m to one, thereby minimizing the power consumption in the SSD 100. Moreover, in the cases other than the count values of "01h" and "80h", the upper limit of the number of banks that are driven simultaneously in parallel is set to N by setting the host allowable parallelism m to N. The number N indicates the upper limit of the number of banks capable of simultaneous writing as a circuit. In the present embodiment, the number N does not correspond to with standby/without standby in the ATA command system.

Figure 7:
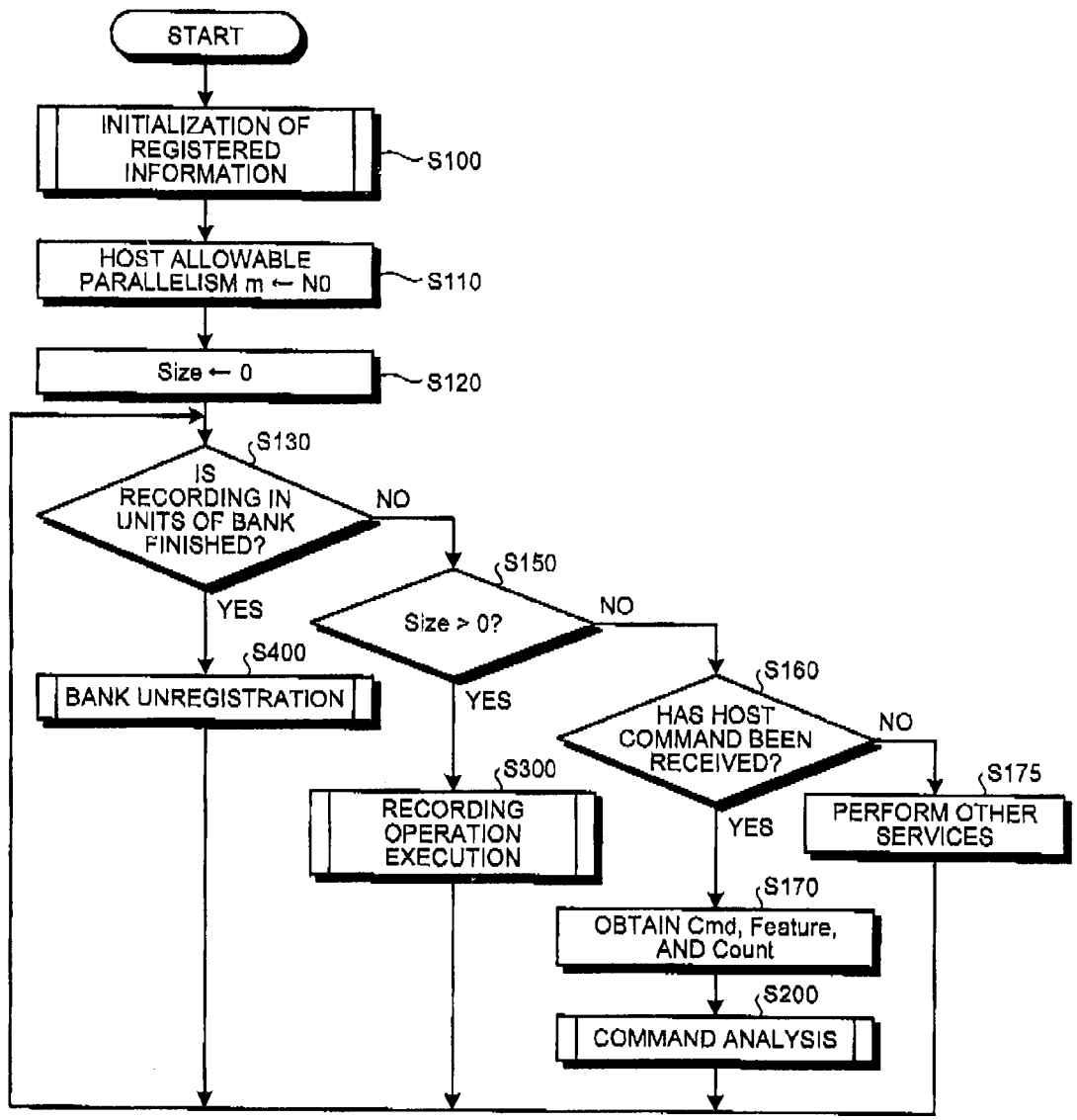
FIG. 7 is a flowchart illustrating an overall process procedure of the write operation.
Figure 8:
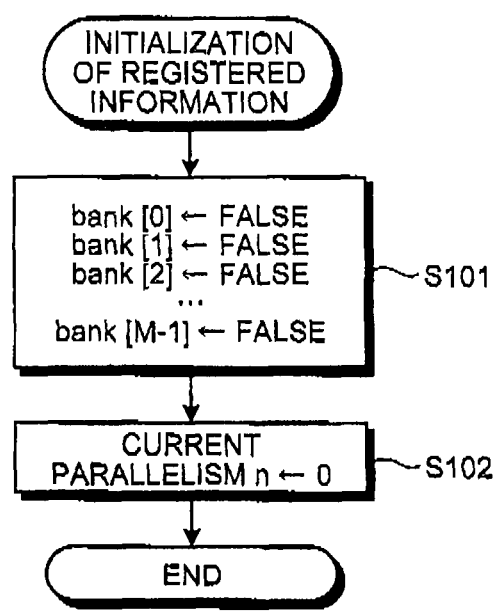
FIG. 8 is a flowchart illustrating a procedure of initialization processing of registered information.
Figure 9:
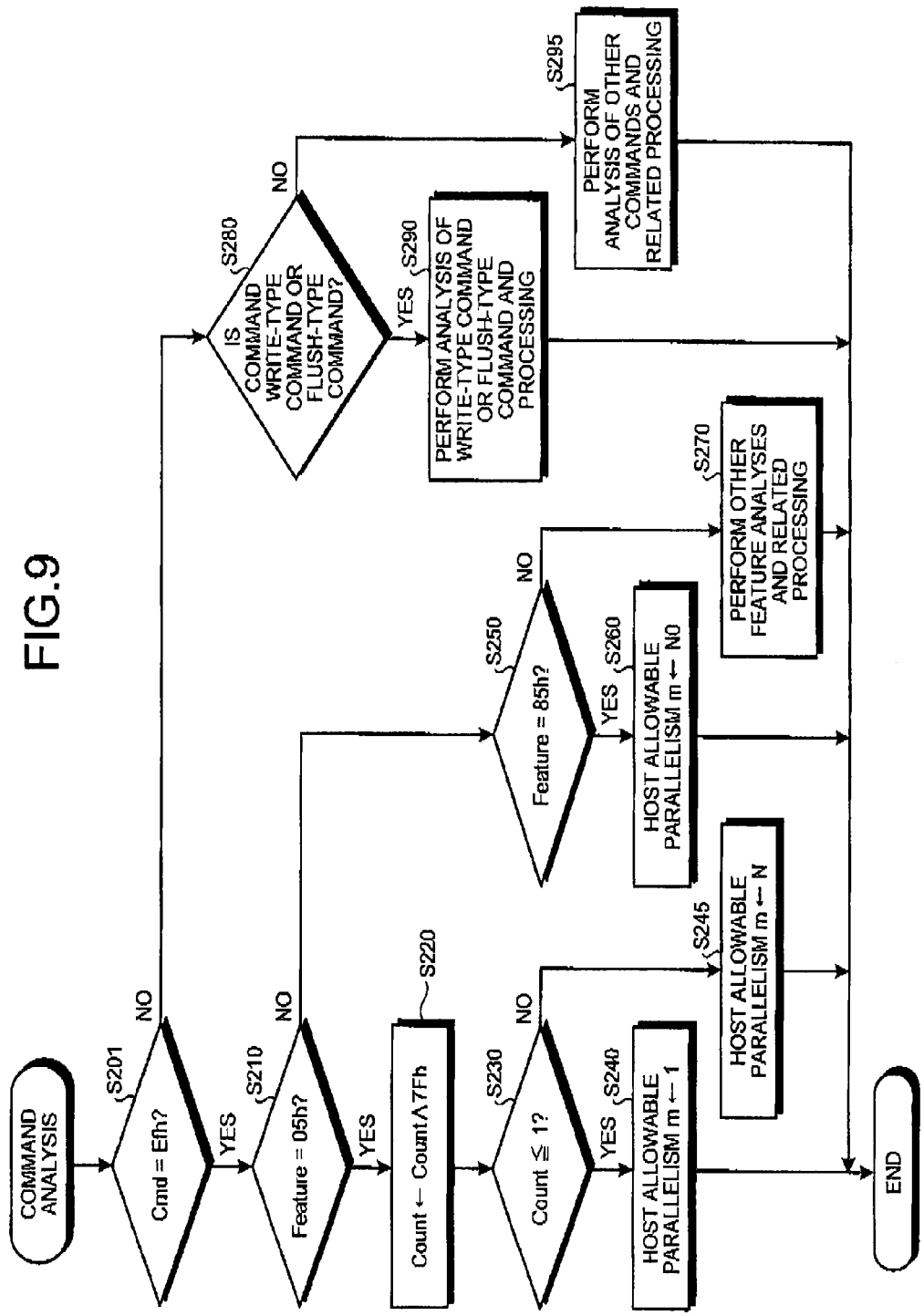
FIG. 9 is a flowchart illustrating a procedure of command analysis processing.
Figure 10:
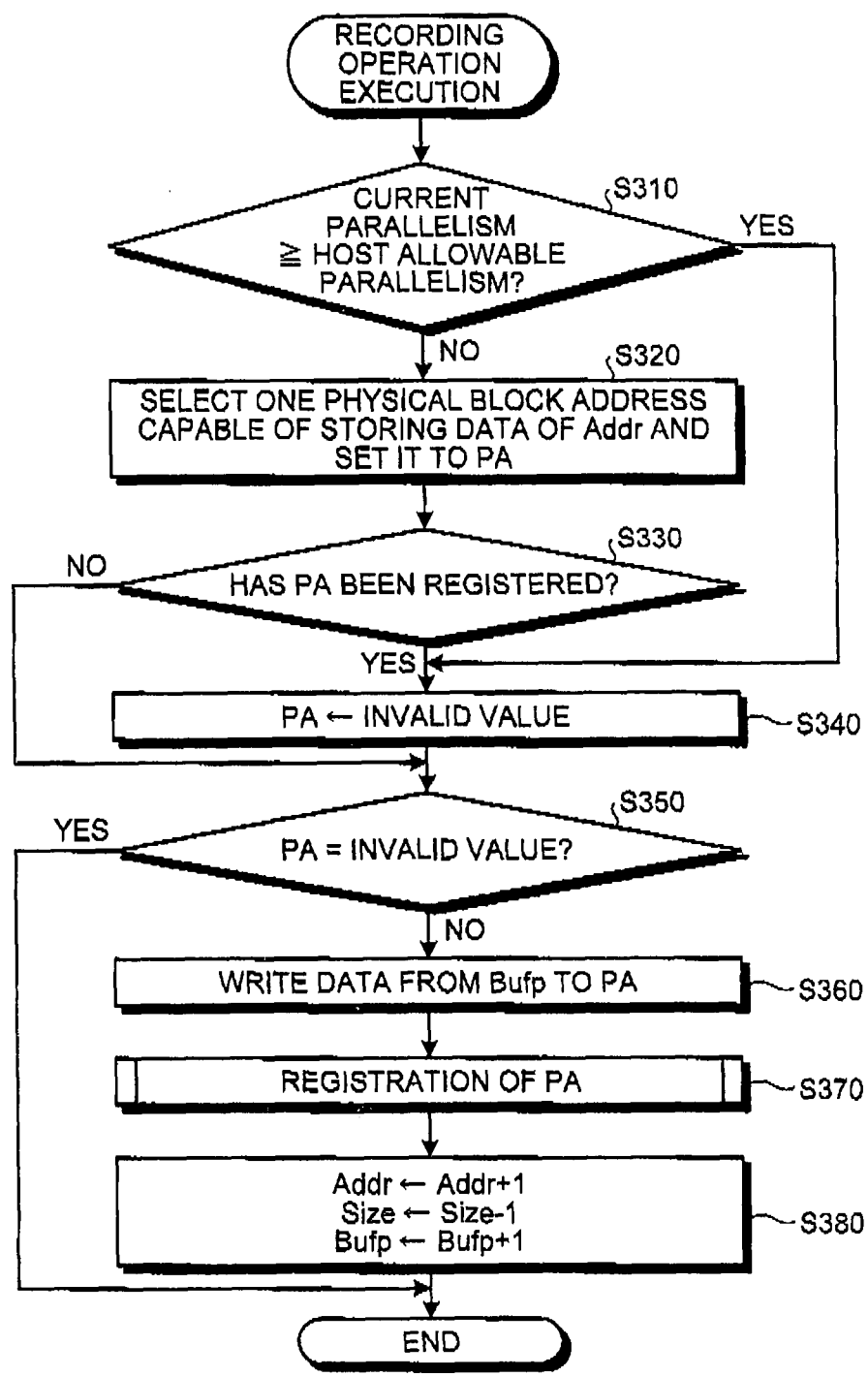
FIG. 10 is a flowchart illustrating a procedure of recording-operation execution processing.
Figure 11:
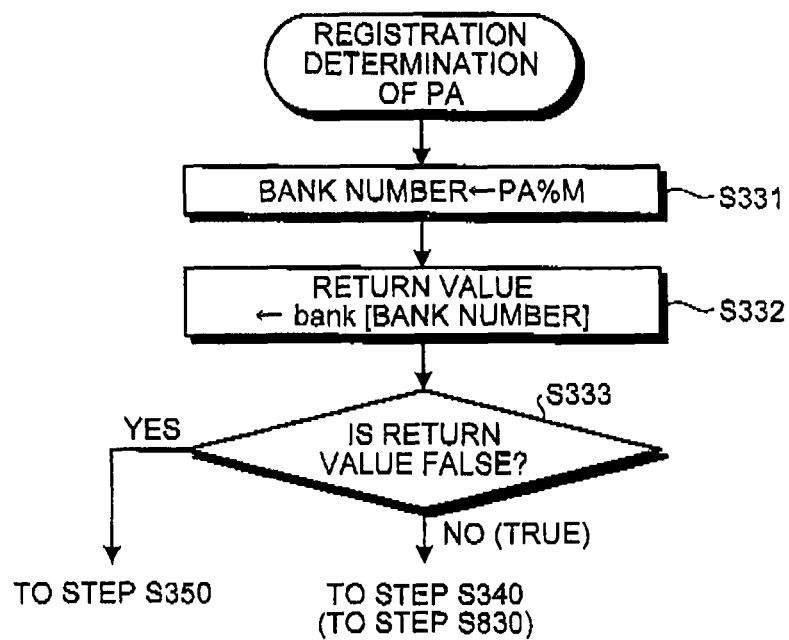
FIG. 11 is a flowchart illustrating a procedure of registration determination processing of a physical block address.
Figure 12:
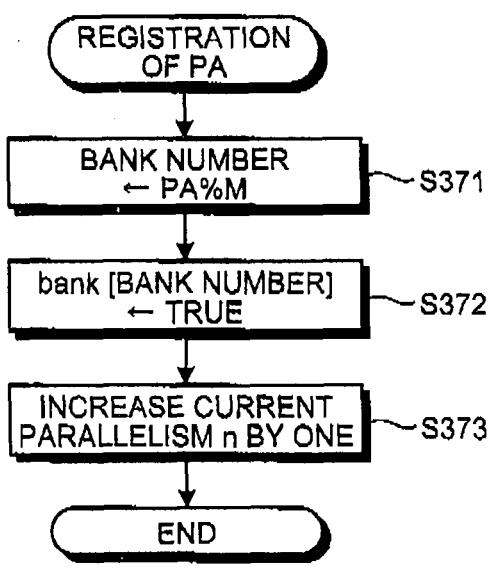
FIG. 12 is a flowchart illustrating a procedure of registration processing of a physical block address.
Figure 13:
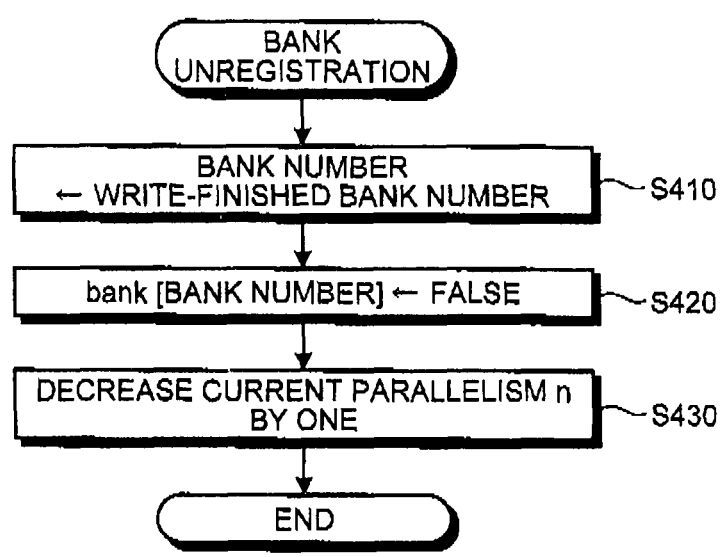
FIG. 13 is a flowchart illustrating a procedure of bank unregistration processing.

The operation of the present embodiment is explained below with reference to FIG. 7 to FIG. 13. FIG. 7 is a flowchart illustrating a whole operation procedure in the drive control circuit 4 when writing data received from the host 1 to the NAND memory 10. FIG. 8 is a flowchart illustrating a detailed procedure of registered-information initialization processing (Step S100) in FIG. 7. FIG. 9 is a flowchart illustrating a detailed procedure of command analysis processing (Step S200) in FIG. 7. FIG. 10 is a flowchart illustrating a detailed procedure of recording-operation execution processing (Step S300) in FIG. 7. FIG. 11 is a flowchart illustrating a detailed procedure of registration determination processing of PA (Step S330) in FIG. 10. FIG. 12 is a flowchart illustrating a detailed procedure of registration processing of PA (Step S370) in FIG. 10. FIG. 13 is a flowchart illustrating a detailed procedure of bank unregistration processing (Step S400) in FIG. 7.

In FIG. 7, first, the processor 104 of the drive control circuit 4 performs the initialization processing of registered information (Step S100). Bank-use information bank [ ], which is the management information (internal variable) used in the processor 104, is an array of M elements (M is the number of banks) and each element takes a logical value (truth-value). The truth-value is updated such that when the logical value is "true", the bank is in use (recording is being performed), and when the logical value is "false", the bank is unused (recording is not being performed). In the initialization processing of the registered information, as shown in FIG. 8, the processor 104 first initializes the bank-use information bank [0] to bank [M−1] to "false", i.e., unused (Step S101), and the current parallelism n (current actual bank parallelism) to zero (Step S102).

Next, the processor 104 sets the host allowable parallelism m to an initial value N0 (Step S110 in FIG. 7). This initial value N0 determines the bank parallelism in the NAND memory 10 when the power management command is not input from the host 1. The initial value N0 can be set to one not to perform the bank parallel operation or can be set to four to secure the maximum bank parallelism. In other words, the initial value N0 is appropriately set according to the specifications of the SSD 100. Next, the processor 104 initializes the number of recording blocks Size as the management information to zero (Step S120). The number of recording blocks Size is the number of blocks waiting for start of writing, which will be described later.

In the flowchart in FIG. 7, it is determined whether recording in units of a bank is finished at Step S130. If recording in units of a bank is finished, the bank unregistration processing is performed (S400). If recording in units of a bank is not finished at Step S130, the number of recording blocks Size is compared with zero at Step S150 to determine whether a block waiting for writing to the NAND memory 10 still remains. If a block waiting for writing remains, the recording operation is performed (Step S300). At Step S150, if it is determined that a block waiting for writing does not remain, it is determined whether a host command has been received (Step S160). If the host command has been received, command obtaining processing (Step S160) and the command analysis processing (Step S200) are performed. In other words, in the flowchart in FIG. 7, during the recording operation, the recording operation execution at Step S300 and the bank unregistration processing at Step S400 are repeatedly performed until the number of recording blocks Size becomes zero while performing the determination at Step S300.

Immediately after turning on the power, the determination at Step S130 becomes No and the determination at Step S150 also becomes No. At Step S160, the ATA controller 111 determines whether a command has been received from the host 1. If the ATA controller 111 has not received a command from the host 1, the processor 104 causes to perform internal processing of the SSD 100, such as wear leveling and refresh, other than the instruction from the host 1 (Step S175). The processing other than the instruction from the host 1 also includes buffer organizing for keeping an appropriate amount of free memory in the buffer unit 21. If the ATA controller 111 has received a command from the host 1, the ATA controller 111 notifies the processor 104 of the received command, a feature (command modification), and a count (command argument). The command analyzing unit 71 of the processor 104 analyzes the received command, the feature, and the count (Step S200).

FIG. 9 illustrates details of the command analysis processing. The command analyzing unit 71 determines whether the received command is "EFh" to determine whether the received command is the set feature (Step S201 in FIG. 9). If the received command is not the set feature, the command analyzing unit 71 determines whether the received command is a write-type command or a flush-type command (data flush from the buffer unit 21 to the NAND memory 10) (Step S280). If the received command is neither the write-type command nor the flush-type command, analysis processing of other commands and processing corresponding to the analysis result are performed (Step S295). If the received command is the write-type command or the flush-type command, the command analyzing unit 71 performs analysis processing of the write-type command or the flush-type command and processing corresponding to the analysis result (Step S290).

The processing performed at Step S290 is explained. When the command analyzing unit 71 receives instructions, such as data writing and flush processing of recorded data, from the host 1, the command analyzing unit 71 outputs a write request (recording request) of transferring data, which is buffered in the buffer unit 21 as need, to the NAND memory 10, to the recording control unit 72. In the similar manner, when the buffer organizing is performed at Step S175, the command analyzing unit 71 outputs a write request of transferring data, which is buffered in the buffer unit 21 as need, to the NAND memory 10, to the recording control unit 72. When outputting the recording request to the recording control unit 72, the command analyzing unit 71 writes necessary values to the logical block address Addr of data corresponding to the recording request, the buffer position Bufp as the management information indicating a head storing position of data corresponding to the recording request in the buffer unit 21, and the number of recording blocks Size indicating the number of blocks waiting for writing of data corresponding to the recording request.

When the recording control unit 72 receives the recording request from the command analyzing unit 71, the recording control unit 72 performs control of writing data buffered in the buffer unit 21 to the NAND memory 10 with reference to the logical block address Addr, the buffer position Bufp, and the number of recording blocks Size. When the recording control unit 72 has not received the power management command from the host 1, as described above, the recording control unit 72 performs writing on the NAND memory 10 with the bank parallelism in accordance with the host allowable parallelism m=N0 (initial value) initially set at Step S110. When a value larger than zero is once written in the number of recording blocks Size, the processing from Step S160 cannot be performed. Therefore, the command analyzing unit 71 cannot issue a new recording request for writing data in the buffer unit 21 to the NAND memory 10 until this number of recording blocks Size is returned to zero by the recording control unit 72.

If the command received at Step S201 is the set feature "EFh", the command analyzing unit 71 next determines whether the feature is "05h" to determine whether "Enable the APM feature set" for enabling the power management is specified (Step S210). If the enable of the power management is specified with the feature, the command analyzing unit 71 next takes a logical product of the above described value specified in the count and "7Fh" to cause the highest-order bit of the count to be ignored (Step S220). The command analyzing unit 71 determines whether the above logical product is equal to or less than "01h" (Step S230). If the logical product is equal to or less than "01h", the upper limit of the number of banks that are driven simultaneously in parallel is set to one by setting the host allowable parallelism m to one (Step S240), thereby minimizing the power consumption in the SSD 100. On the other hand, if the logical product is larger than "01h", the upper limit of the number of banks that are driven simultaneously in parallel is set to N that is the maximum value as a circuit described above by setting the host allowable parallelism m to N (Step S245).

If the logical product is equal to or less than "01h", in the above described "the APM feature set", the cases, in which (b) 01h: minimum power consumption/with standby and (d) 80h: minimum power consumption/without standby are specified, are included. If the logical product is not equal to or less than "01h", the cases, in which (d) 80h: minimum power consumption/without standby and (f) FEh: maximum performance are specified, are included. In the intermediate power consumption other than the cases where the count value is 01h, 80h, and FEh, the host allowable parallelism becomes one or N.

If the determination at Step S210 is No, the command analyzing unit 71 determines whether the feature is "85h" to determine whether "Disable the APM feature set" for disabling the power management is specified (Step S250). If the disable of the power management is not specified with the feature, the command analyzing unit 71 performs other feature analyses and processing corresponding to the analysis result (Step S270). If the disable of the power management is specified with the feature, the command analyzing unit 71 sets the host allowable parallelism m to the initial value N0.

As described above, at Step S290 in FIG. 9, when the write-type processing or the flush-type processing occurs, the recording request is issued from the command analyzing unit 71 to the recording control unit 72 and required values are written in the logical address Addr, the buffer position Bufp, and the number of recording blocks Size as the management information. Therefore, when the write-type processing or the flush-type processing occurs, first, the determination at Step S130 in FIG. 7 becomes No and the determination at Step S150 in FIG. 7 becomes Yes, and the recording operation by the recording control unit 72 is performed (Step S300).

FIG. 10 illustrates details of the recording operation at Step S300. When the recording operation is started, the recording control unit 72 determines whether the current parallelism n is equal to or more than the host allowable parallelism m (Step S310 in FIG. 10). First, the operation before the input of the power management command from the host 1 is explained.

Before the power management command is input from the host 1, the recording control unit 72 performs the bank parallel operation under the condition that the host allowable parallelism m is N0 (initial value) that is set at Step S110 in FIG. 7. In this example, the case is explained in which N0 is set to four.

At Step S310, if the current parallelism n is equal to or more than the host allowable parallelism m, the recording control unit 72 skips the procedure to proceed to Step S340 and sets an invalid value to PA. At Step S310, if the current parallelism n is less than the host allowable parallelism m, the recording control unit 72 determines a physical block address in which data of the logical block address Addr can be stored based on the logical block address Addr. As described above, in the present embodiment, the bank number, to which the physical block obtained by the logical block address Addr belongs, is determined. Then, the recording control unit 72 sets the calculated physical block address to the physical block address PA (Step S320). Next, the recording control unit 72 determines whether the physical block address PA has already been registered, i.e., the physical block address PA is in use (Step S330).

FIG. 11 illustrates a detailed procedure at Step S330. First, the recording control unit 72 calculates a remainder obtained by dividing PA by the number of banks NI (in this case, M=8) based on equation (1) and sets the obtained remainder to the bank number (Step S331). The recording control unit 72 refers to the state of the bank-use information bank [bank number] corresponding to the remainder obtained at Step S331. If the bank [bank number] is false, the recording control unit 72 determines that the physical block address PA has not been registered (recording is not being performed) and the procedure moves to Step S350, and if the bank [bank number] is true, the recording control unit 72 determines that the physical block address PA has been registered (recording is being performed) and the process moves to Step S340.

At Step S340, the recording control unit 72 sets an invalid value to the physical block address PA. At Step S350, the recording control unit 72 determines whether the physical block address PA is an invalid value. If the physical block address PA is an invalid value, the process ends and the procedure moves to Step S130 in FIG. 7. If the recording control unit 72 determines that the physical block address PA is not an invalid value, the recording control unit 72 reads out data from the position of the buffer unit 21 specified by the buffer position Bufp, and writes the read out data in a physical block specified by the physical block address PA of the NAND memory 10 (Step S360). Next, the recording control unit 72 performs the registration processing of the physical block address PA (Step S370).

FIG. 12 illustrates details of the registration processing of PA at Step S370. In the registration processing of PA, the recording control unit 72 first sets a remainder calculated by equation (1) to the bank number (#B) (Step S371), and sets the bank-use information bank [#8] corresponding to the set bank number to true, i.e., in use (Step S372). Then, the current parallelism n is increased by one (Step S373).

Next, the recording control unit 72 increases the logical block address Addr by one, increases the buffer position Bufp by one, and decreases the number of recording blocks Size by one (Step S380 in FIG. 10). When the processing at Step S380 is finished, the procedure moves to Step S130 in FIG. 7.

At Step S130 in FIG. 7, the recording control unit 72 determines whether recording in units of a bank has finished. If the recording operation to a certain bank has finished, the recording control unit 72 performs the bank unregistration processing (Step S400).

FIG. 13 illustrates details of the bank unregistration processing at Step S400. The recording control unit 72 first sets the number of a bank, for which writing is finished, to the bank number (#B). Then, the bank-use information bank [#B] corresponding to the bank number is set to false, i.e., unused (Step S420). Then, the current parallelism n is decreased by one (Step S430).

For example, it is assumed that a sequential writing of writing data having Addr=0, 1, 2, 3, and 4 (five blocks) as shown in FIG. 4 from the buffer unit 21 to the NAND memory 10 occurs. It is assumed that the current parallelism n is zero at the start point of the sequential writing and the host allowable parallelism is the initial value N0 (=4). In the following, the procedure of writing blocks of Addr=0, 1, 2, 3, and 4 is explained in order. The initial number of recording blocks Size in this case is five.

(1) Block of Addr=0

The determination at Step S310 becomes No and the physical block address PA in which the block of Addr=0 is to be written is determined at Step S320. In this case, the determination at Step S330 becomes No, the determination at Step S350 becomes No, and data is written in PA at Step S360. The bank number #B is set to zero at Step S371 in FIG. 12, and true (recording is being performed) is set to the bank-use information bank [#B=0] at Step S372, so that the current parallelism n is increased by one to become one. Next, at Step S380 in FIG. 10, the logical block address Addr is increased by one, the buffer position Bufp is increased by one, and the number of recording blocks Size is decreased by one to become four.

(2) Blocks of Addr=1 to 3

The processing similar to that for the block of Addr=0 is performed, and consequently, the current parallelism n becomes four and the number of recording blocks Size becomes one.

(3) Block of Addr=4

Because the current parallelism n is four and the host allowable parallelism m is four, the determination at Step S310 becomes Yes and an invalid value is set to the physical block address PA at Step S340, and as a result of the determination at Step S350, the procedure moves to Step S130 in FIG. 7. The loop of Step S130, Step S150, Step S310, Step 340, and Step S350 is repeated until the recording operation is finished in any of the banks of #B=0 to 3. As shown in FIG. 4, it is assumed that the recording operation of the data of Addr=0 is finished in the bank of #B=0. Consequently, the determination at Step S130 in FIG. 7 becomes Yes and the bank unregistration is performed. The number "0" of the bank in which the recording operation is finished is set to the bank number #B at Step S410 in FIG. 13, false (unused) is set to the bank-use information bank [#B=0] (Step S420), and the current parallelism n is decreased by one to become three. Thereafter, the procedure moves to Step S310 in FIG. 10 via Step S130 and Step S150. In this stage, the determination at Step S310 becomes No, a physical block of a bank of #B=4 capable of storing data of Addr=4 is selected to be set to PA (Step S320). Thereafter, via Step S330, Step S340, and Step S350, the data of Addr=4 is written in the physical block of the bank of #B=4 at Step S360.

For example, as shown in FIG. 4, in the case of writing data having Addr=0, 1, 2, 3, and 8, when writing data of Addr=8, the determination at Step S330 in FIG. 10 becomes Yes. In other words, because the data of Addr=8 can be written only in a bank of #B=0, writing of the data of Addr=8 cannot be performed unless writing of the data of Addr=0 in the bank of #B=0 is finished.

In this manner, before the power management command is input from the host 1, at Step S320 in FIG. 10, if the current parallelism n is equal to or more than N that is the host allowable parallelism m, the value substituted into PA is an invalid value. When PA is an invalid value, the recording-operation execution processing immediately ends by the determination at Step S350 to return to the control loop shown in FIG. 7, and the recording-operation execution processing is recalled again. Such processing is repeated. The repetition continues until recording is determined to finish at Step S130 in FIG. 7 and the bank is unregistered at Step S400.

On the other hand, if the current parallelism n is less than N that is the host allowable parallelism m, the value set to PA at Step S320 in FIG. 10 depends on whether writing is already performed in a recording unit belonging to the bank. Specifically, if writing is already performed, an invalid value is set, and if writing has not been performed, the number of a physical block in a recording unit to be written is set. Then, if PA is not an invalid value, writing is performed on a physical block specified by PA.

In this manner, as shown in FIG. 4, the number of blocks on which writing is performed simultaneously increases until the current parallelism n becomes the host allowable parallelism m; however, when the current parallelism n matches the host allowable parallelism m, the next writing is kept waiting until the current parallelism n becomes smaller than the host allowable parallelism m. Consequently, writing can always be performed with the parallelism equal to or less than the host allowable parallelism m.

Next, it is assumed that the host 1 issues the power management command having Cmd=EFh, Feature=05h, and Count=1, and thereafter, the recording operation similar to the above is performed. After the host 1 issues the power management command having Count=1, the host allowable parallelism m is set to one at Step S240 in FIG. 9. Consequently, writing is performed while keeping the state where the current parallelism n is always one or less by the processing similar to the above. In this manner, the SSD 100 can always perform writing with the bank parallelism equal to or less than that required by the host 1. If the host 1 sets such that Feature=05h and Count>1, or Feature=85h, to cancel the power-saving state, the bank parallel operation is restarted.

In this manner, according to the first embodiment, writing is performed on the SSD 100 side with the bank parallelism within a range not exceeding the maximum parallelism required by the power management command issued from the host 1. Consequently, for example, even a laptop computer with high constraints on power capacity can perform writing safely by the host 1 issuing the power management command.

In the flowchart in FIG. 7, detection of finishing recording in units of a bank (Step S130), the bank unregistration (Step S400), and the recording operation when Size>0 (Step S300) are repeated from the loop in FIG. 7; however, the detection of finishing recording in units of a bank can be realized in the form of interrupt processing by handling this event as an interrupt vector. The detection of finishing recording in units of a bank can be changed to the form in which control is not returned until all necessary writing instructions are finished by moving the bank unregistration processing to the interrupt processing, instead of performing the detection from the loop in FIG. 7.

Moreover, in the above embodiment, the host allowable parallelism m is rewritten by using a function of the APM in the SET FEATURE commands of the ATA standard; however, the similar object can be generated by an appropriate vendor command or the host allowable parallelism m can be rewritten by using a command having the similar object on an interface standard different from the ATA standard. In the similar manner, in the case where WRITE and FLUSH type commands are also the ATA standard, they correspond to a plurality of commands, such as Cmd=CAh (WRITE DMA), 35h (WRITE DMA EXT), and E7h (FLUSH CACHE). However, they are not limited thereto and can be applied to a vendor command or a command having similar object on an interface standard different from the ATA in the similar manner.

(Second Embodiment)

Figure 14:
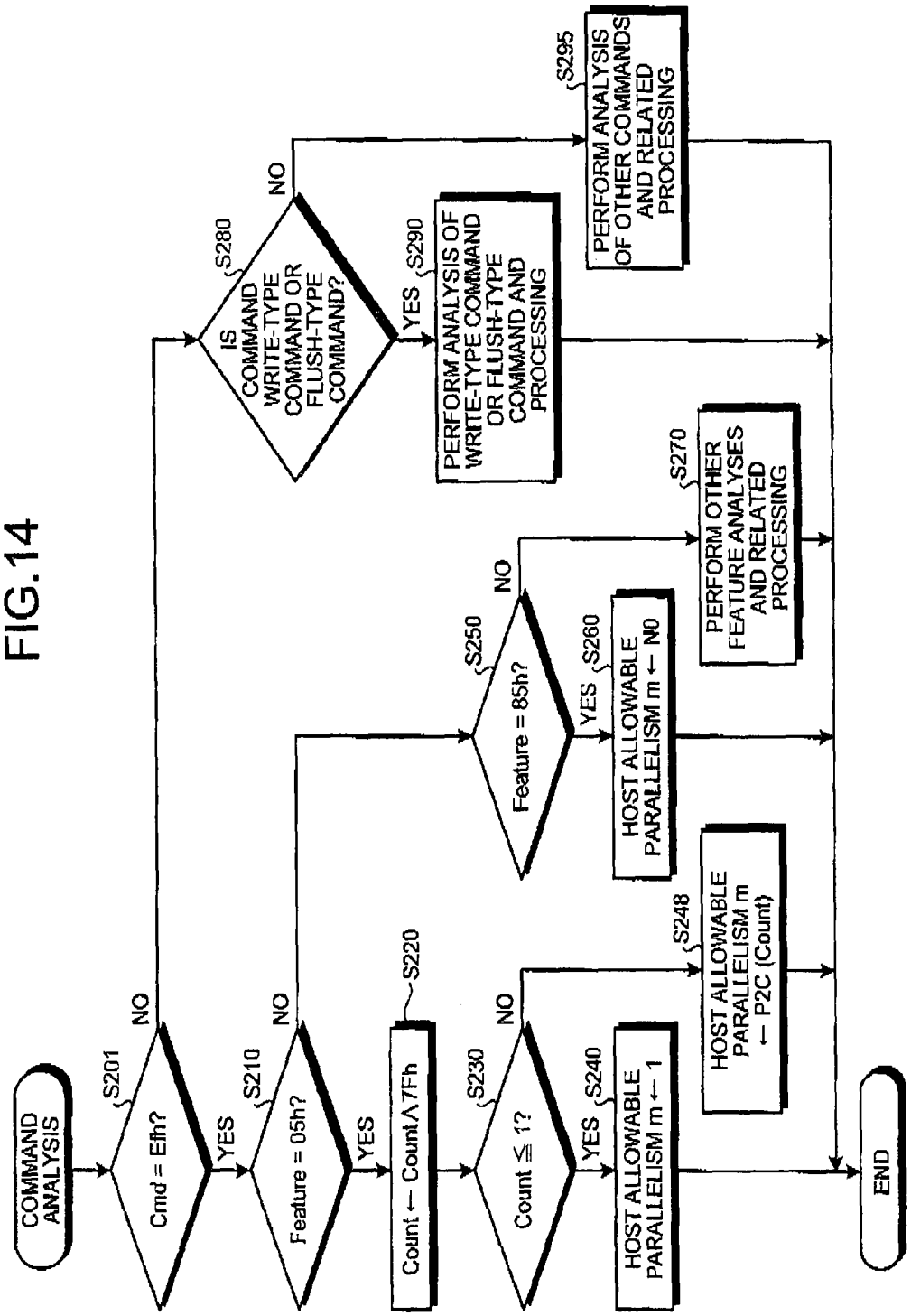
FIG. 14 is a flowchart illustrating an operation procedure of a second embodiment.

In the first embodiment, the host allowable parallelism m is controlled in two stages of the maximum number N and one indicating no parallelism in accordance with the Count value of the ATA command. In the second embodiment, the host allowable parallelism m is controlled in three or more stages between the maximum number N and one indicating no parallelism. Specifically, in the first embodiment, the SSD includes two power management modes; however, in the second embodiment, the SSD includes three or more power management modes and the upper limit of the number of banks to be operated in parallel is made different among the power management modes. In the second embodiment, instead of the command analysis processing shown in FIG. 9, the command analysis processing shown in FIG. 14 is employed. Other procedures are similar to those in the first embodiment, and overlapping explanation is omitted. In FIG. 14, Step S245 in FIG. 9 is replaced by Step S248.

At Step S230, the command analyzing unit 71 determines whether the logical product of the count and "7Fh" is equal to or less than "01h". If the logical product is equal to or less than "01h", the upper limit of the number of banks that are driven simultaneously in parallel is set to one by setting the host allowable parallelism m to one (Step S240), thereby minimizing the power consumption in the SSD 100. On the other hand, if the logical product is larger than "01h", the command analyzing unit 71 sets a value of a numerical transformation function (P2C) to the host allowable parallelism m (Step S248).

The definition of P2C (Count) is as follows, in which C0 is a step size of certain power and is, for example, 100 mW.

If Count<(maximum power needed for operation when the host allowable parallelism is two)/C0, P2C (Count)=1, if (maximum power needed for operation when the host allowable parallelism is two)/C0≤Count<(maximum power needed for operation when the host allowable parallelism is three)/C0, P2C (Count)=2,

. . . , if (maximum power needed for operation when the host allowable parallelism is (N−1))/C0≤Count<(maximum power needed for operation when the host allowable parallelism is N)/C0, P2C (Count)=N−1, and if Count≥(maximum power needed for operation when the host allowable parallelism is N)/C0, P2C (Count)=N.

The maximum power needed for operation with each parallelism is obtained by actually measuring it in the process of manufacturing a product.

In this manner, according to the second embodiment, the host allowable parallelism m is controlled in three or more stages in accordance with the power management command from the host, so that the power consumption management can be performed more accurately.

(Third Embodiment)

In the first embodiment, a predetermined relationship represented by equation (1) is satisfied between the logical address Addr and the bank number #B. In the third embodiment, there is no such relationship, and a block in which data of a certain logical address Addr is to be recorded can belong to any bank among a plurality of banks. In other words, in the third embodiment, a logical-to-physical translation system is employed, in which the logical address Addr of data specified by the host 1 and a physical address as an actual storage area in the NAND memory 10 are dynamically associated with each other at every data update. In the logical-to-physical translation system, when the bank parallel operation is realized, free blocks with no valid data stored therein are classified for each bank and free blocks are selected from each bank to realize the parallel processing.

In such logical-to-physical translation system, in order to increase the possibility of simultaneous writing as high as possible, a desirable bank or a free block, to which data of the logical address Addr is recorded at a certain moment, is determined considering various purposes, such as that the number of free blocks is made equal among banks and selection of free blocks is performed as fast as possible. The rule for determining a desirable bank or a free block varies depending on the implementation of the SSD. In the third embodiment, when the address PA of a physical block is simply selected, first, the most desirable bank and a physical block belonging to this bank are selected. If the selected physical block of the bank can be used, the selected physical block of the bank is selected. If the selected physical block of the most desirable bank is subjected to writing and cannot be used, the second most desirable bank and a physical block belonging to this bank are selected. If the selected physical block of the second most desirable bank can be used, the selected physical block of the second most desirable bank is selected. If the selected physical block of the second most desirable bank is subjected to writing and cannot be used, the third most desirable bank and the physical block belonging to this bank are selected. The above processing is repeated.

Figure 15:
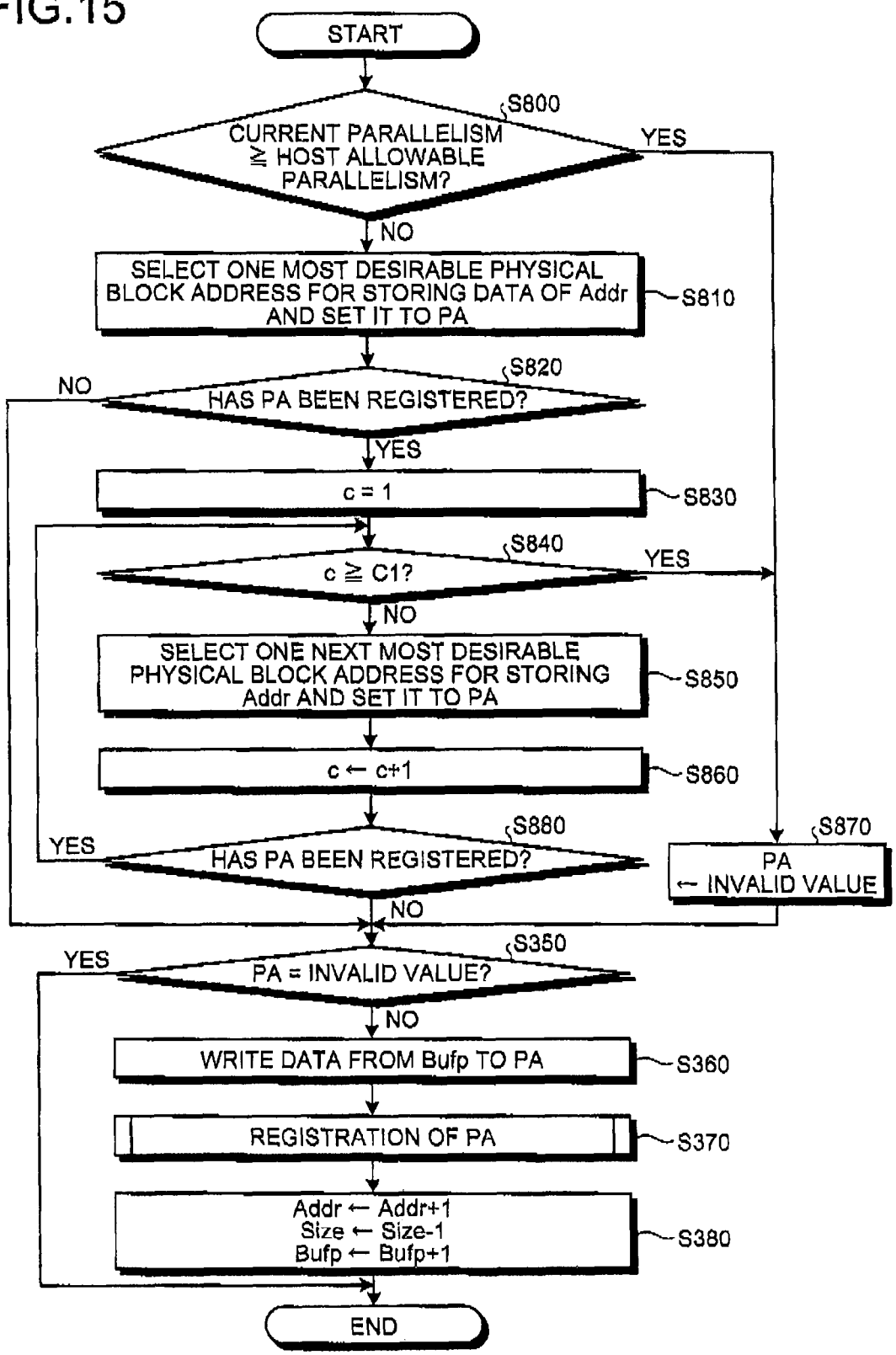
FIG. 15 is a flowchart illustrating an operation procedure of the second embodiment.

In the third embodiment, instead of the above recording-operation execution processing shown in FIG. 10, the recording-operation execution processing shown in FIG. 15 is employed. Other procedures are similar to those in the first embodiment, and overlapping explanation is omitted. In FIG. 15, Steps S310 to S340 in FIG. 10 are replaced by Steps S800 to S880.

In FIG. 15, when the recording operation is started, the recording control unit 72 determines whether the current parallelism n is equal to or more than the host allowable parallelism m (Step S800). At Step S800, if the current parallelism n is equal to or more than the host allowable parallelism m, the recording control unit 72 sets an invalid value to PA (Step S870). At Step S800, if the current parallelism n is less than the host allowable parallelism m, the recording control unit 72 selects one most desirable physical block address capable of storing therein data of the logical block address Addr, and sets the selected physical block address to PA (Step S810).

Next, the recording control unit 72 determines whether writing is being performed on a bank of PA to which the most desirable physical block address is set in the procedure shown in FIG. 12 (Step S820), and if writing is not being performed, the procedure moves to Step S350 and the processing similar to the above is performed. In the determination at step S820, if it is determined that writing is being performed on the bank of PA to which the most desirable physical block address is set, a variable c for count is initialized to one (Step S830), and next, it is determined whether the variable c is equal to or less than a constant C1 (Step S840). The constant C1 is a value equal to or less than the number of banks M and represents the maximum number of times of selection when selecting a desirable physical block address.

If the determination at Step S840 is No, the recording control unit 72 selects one next desirable physical block address capable of storing therein data of the logical block address Addr, and sets the selected physical block address to PA (Step S850). Next, the recording control unit 72 increases the variable c by one (Step S860) and further determines whether writing is being performed on the bank of PA to which the next desirable physical block address is set (Step S880). If writing is not being performed, the procedure moves to Step S350 and the processing similar to the above is performed.

If the determination at Step S880 is Yes, the selection processing of the next desirable physical block (with a lower optimal degree) is sequentially performed until an unused physical block is selected, until the variable c matches the constant C1. If a physical block cannot be selected until the variable c matches the constant C1, an invalid value is set to PA at the time when the variable c matches the constant C1, and the procedure moves to Step S350.

In this manner, according to the third embodiment, even in the case of employing the logical-to-physical translation system in which a logical address and a physical address are dynamically associated with each other at every writing of data, the bank parallelism can be dynamically and variably controlled in accordance with the power management command from the host.

(Fourth Embodiment)

Figure 16:
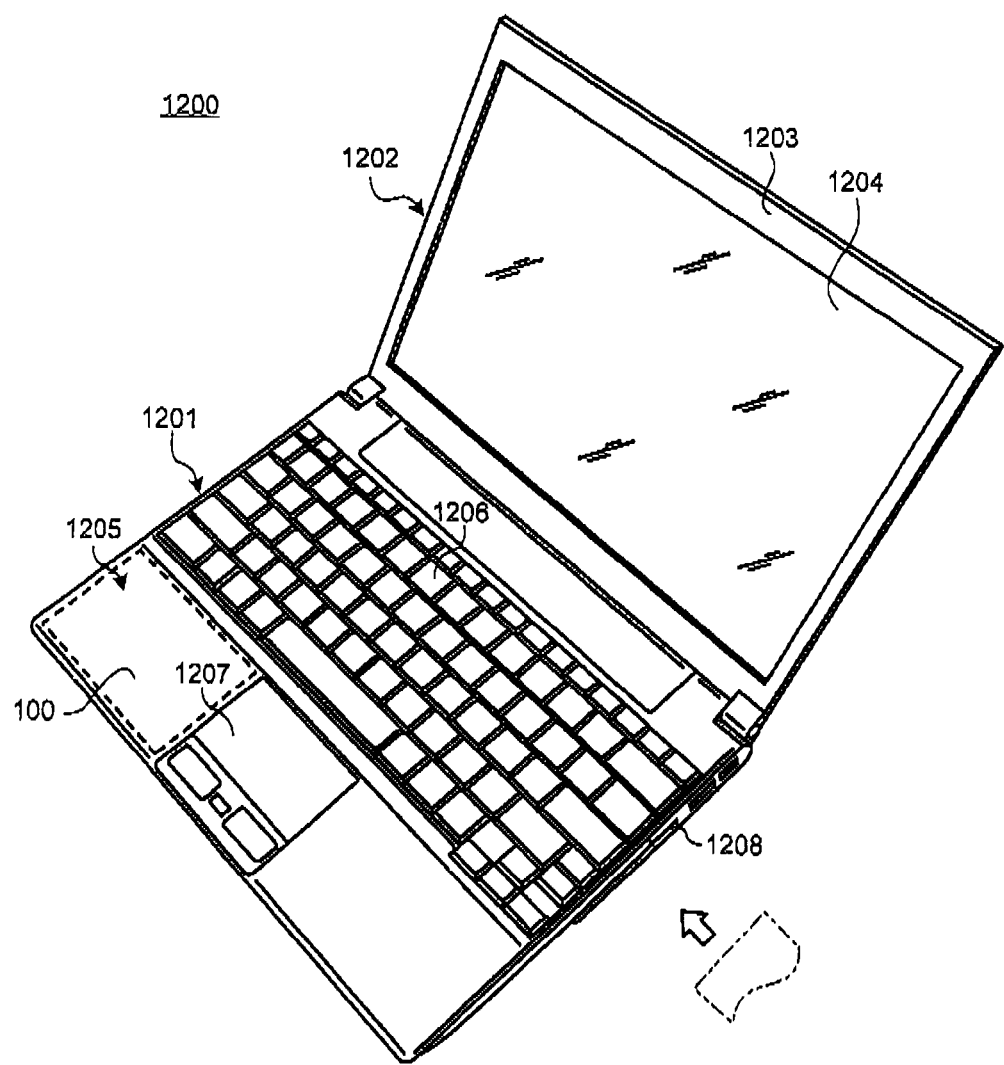
FIG. 16 is an overall view of a personal computer on which an SSD is mounted.

FIG. 16 is a perspective view illustrating an example of a personal computer (PC) 1200 on which the SSD 100 is mounted. The PC 1200 includes a main body 1201 and a display unit 1202. The display unit 1202 includes a display housing 1203 and a display device 1204 accommodated in the display housing 1203.

The main body 1201 includes a chassis 1205, a keyboard 1206, and a touch pad 1207 as a pointing device. The chassis 1205 includes therein a main circuit board, an optical disk device (ODD) unit, a card slot, the SSD 100, and the like.

The card slot is provided so as to be adjacent to the Peripheral wall of the chassis 1205. The peripheral wall has an opening 1208 facing the card slot. A user can insert and remove an additional device into and from the card slot from outside the chassis 1205 through the opening 1208.

The SSD 100 can be used instead of a conventional hard disk drive (HDD) in the state of being mounted on the PC 1200 or can be used as an additional device in the state of being inserted into the card slot included in the PC 1200.

Figure 17:
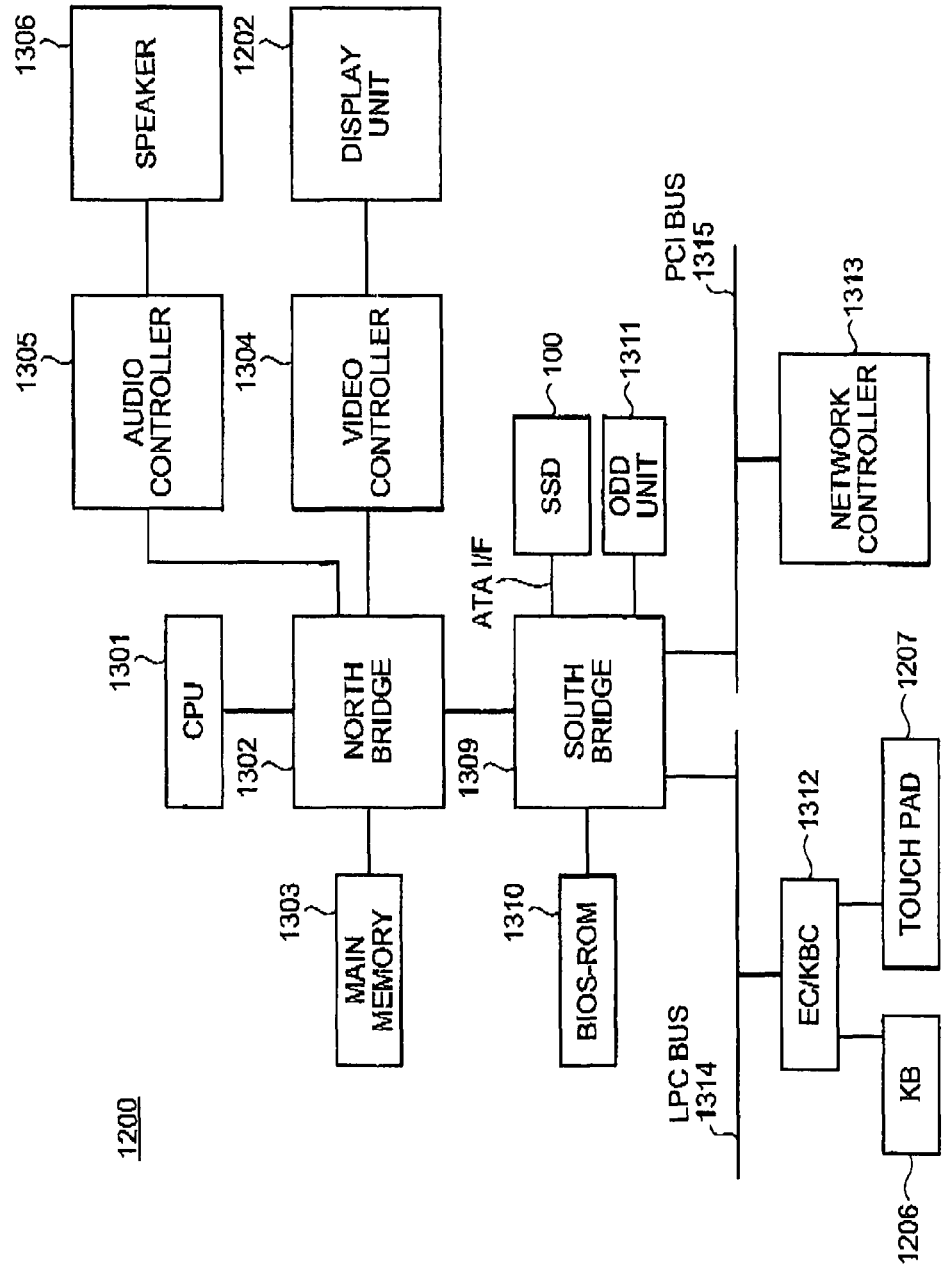
FIG. 17 is a diagram illustrating a system configuration example of the personal computer on which the SSD is mounted.

FIG. 17 illustrates a system configuration example of the PC on which the SSD is mounted. The PC 1200 includes a CPU 1301, a north bridge 1302, a main memory 1303, a video controller 1304, an audio controller 1305, a south bridge 1309, a basic input/output system read-only memory (BIOS-ROM) 1310, the SSD 100, an ODD unit 1311, an embedded controller/keyboard controller IC (EC/KBC) 1312, a network controller 1313, and the like.

The CPU 1301 is a processor provided for controlling an operation of the PC 1200, and executes an operating system (OS) loaded from the SSD 100 onto the main memory 1303. Furthermore, when the ODD unit 1311 is capable of executing at least one of read processing and write processing on a mounted optical disk, the CPU 1301 executes the processing.

Moreover, the CPU 1301 executes a system BIOS stored in the BIOS-ROM 1310. The system BIOS is a computer program for controlling a hardware in the PC 1200.

The north bridge 1302 is a bridge device that connects a local bus of the CPU 1301 to the south bridge 1309. The north bridge 1302 has a memory controller for controlling an access to the main memory 1303.

Moreover, the north bridge 1302 has a function of executing a communication with the video controller 1304 and a communication with the audio controller 1305 through an accelerated graphics port (AGP) bus and the like.

The main memory 1303 temporarily stores therein a computer program and data, and functions as a work area of the CPU 1301. The main memory 1303, for example, consists of a DRAM.

The video controller 1304 is a video reproduction controller for controlling the display unit 1202 used as a display monitor of the PC 1200.

The audio controller 1305 is an audio reproduction controller for controlling a speaker 1306 of the PC 1200.

The south bridge 1309 controls each device on a low pin count (LPC) bus 1314 and each device on a peripheral component interconnect (PCI) bus 1315. Moreover, the south bridge 1309 controls the SSD 100 that is a memory device storing various types of software and data through the ATA interface.

The PC 1200 accesses the SSD 100 in sector units. A write command, a read command, a flush command, and the like are input to the SSD 100 through the ATA interface.

The south bridge 1309 has a function of controlling an access to the BIOS-ROM 1310 and the ODD unit 1311.

The EC/KBC 1312 is a one-chip microcomputer in which an embedded controller for power management and a keyboard controller for controlling the keyboard (KB) 1206 and the touch pad 1207 are integrated.

The EC/KBC 1312 has a function of turning on/off the PC 1200 based on an operation of a power button by a user. The network controller 1313 is, for example, a communication device that executes communication with an external network such as the Internet.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile semiconductor memory that includes a plurality of banks configured to operate in parallel;
   a command analyzing unit that, upon receiving a power management command from a host apparatus, analyzes received power management command; and
   a recording control unit that dynamically and variably controls an upper limit of number of banks to be operated in parallel at a time of writing in accordance with an analysis result by the command analyzing unit, wherein
   the recording control unit is configured to dynamically associate a logical address input from the host apparatus at a time of writing with a physical address of the nonvolatile semiconductor memory on which a write operation is performed at every data update,
   the logical address input from the host apparatus at a time of writing and a number of a bank on which a write operation is performed are not associated with each other in advance, and
   the recording control unit is configured to:
   determine, at a predetermined timing, a first bank of the nonvolatile semiconductor memory in which data is written;
   write data in a first physical block that belongs to the first bank when the first bank is not being used at the time of writing; and
   write data in a second physical block that belongs to a second bank that is different from the first bank when the first bank is being used at the time of writing.

2. The memory system according to claim 1, wherein the command analyzing unit causes one of a plurality of power management modes to operate in accordance with the received power management command, and causes the upper limit of the number of banks to be operated in parallel to be different in each of the power management modes.

3. The memory system according to claim 2, wherein
   the recording control unit causes a first power management mode, in which the upper limit of the number of banks to be operated in parallel is set to one, to operate when the analysis result by the command analyzing unit specifies a minimum power consumption, and
   the recording control unit causes a second power management mode, in which the upper limit of the number of banks to be operated in parallel is set to a maximum number of banks configured to operate in parallel simultaneously, to operate when the analysis result by the command analyzing unit does not specify the minimum power consumption.

4. The memory system according to claim 1, wherein the recording control unit sets an initial value of the upper limit of the number of banks to be operated in parallel to one when the power management command is not input from the host apparatus.

5. The memory system according to claim 1, wherein the recording control unit sets an initial value of the upper limit of the number of banks to be operated in parallel to the maximum number of banks configured to operate in parallel simultaneously when the power management command is not input from the host apparatus.

6. The memory system according to claim 1, wherein a logical address input from the host apparatus at a time of writing is associated with a number of a bank on which a write operation is performed.

7. The memory system according to claim 1, further comprising a buffer memory that temporarily stores therein data to be written in the nonvolatile semiconductor memory, wherein
   the recording control unit performs writing on the nonvolatile semiconductor memory from the buffer memory when the number of banks that are currently operated in parallel is less than the upper limit.

8. The memory system according to claim 7, wherein the recording control unit causes writing from the buffer memory to the nonvolatile semiconductor memory to keep waiting when the number of banks that are currently operated in parallel is equal to the upper limit.

9. The memory system according to claim 1, further comprising a buffer memory that temporarily stores therein data to be written in the nonvolatile semiconductor memory, wherein
   the recording control unit causes writing from the buffer memory to the nonvolatile semiconductor memory to keep waiting when the number of banks that are currently operated in parallel is equal to the upper limit.

10. A method of controlling a memory system that includes a nonvolatile semiconductor memory including a plurality of banks configured to operate in parallel, the method comprising:

analyzing, upon receiving a power management command from a host apparatus, received power management command;

dynamically and variably controlling an upper limit of number of banks to be operated in parallel at a time of writing in accordance with an analysis result;

dynamically associating a logical address input from the host apparatus at a time of writing with a physical address of the nonvolatile semiconductor memory on which a write operation is performed at every data update;

determining, at a predetermined timing, a first bank of the nonvolatile semiconductor memory in which data is written;

writing data in a first physical block that belongs to the first bank when the first bank is not being used at the time of writing; and writing data in a second physical block that belongs to a second bank that is different from the first bank when the first bank is being used at the time of writing.

11. The method according to claim 10, further comprising:

causing one of a plurality of power management modes to operate in accordance with the received power management command at the analyzing; and causing the upper limit of the number of banks to be operated in parallel to be different in each of the power management modes at the analyzing.

12. The method according to claim 11, further comprising:

causing a first power management mode, in which the upper limit of the number of banks to be operated in parallel is set to one, to operate when the analysis result at the analyzing specifies a minimum power consumption; and causing a second power management mode, in which the upper limit of the number of banks to be operated in parallel is set to a maximum number of banks configured to operate in parallel simultaneously, to operate when the analysis result does not specify a minimum power consumption.

13. The method according to claim 10, wherein the memory system further includes a buffer memory that temporarily stores therein data to be written in the nonvolatile semiconductor memory, and the method further includes performing writing on the nonvolatile semiconductor memory from the buffer memory when the number of banks that are currently operated in parallel is less than the upper limit.

14. The method according to claim 13, further comprising causing writing from the buffer memory to the nonvolatile semiconductor memory to keep waiting when the number of banks that are currently operated in parallel is equal to the upper limit.

15. The method according to claim 10, further comprising:

setting an initial value of the upper limit of the number of banks to be operated in parallel to the maximum number of banks configured to operate in parallel simultaneously when the power management command is not input from the host apparatus.

16. An information processing apparatus comprising:

a host apparatus; and a memory system that includes a nonvolatile semiconductor memory including a plurality of banks configured to operate in parallel, wherein the memory system includes a command analyzing unit that, upon receiving a power management command from the host apparatus, analyzes received power management command, and a recording control unit that dynamically and variably controls an upper limit of number of banks to be operated in parallel at a time of writing in accordance with an analysis result by the command analyzing unit, wherein the recording control unit is configured to dynamically associate a logical address input from the host apparatus at a time of writing with a physical address of the nonvolatile semiconductor memory on which a write operation is performed at every data update, the logical address input from the host apparatus at a time of writing and a number of a bank on which a write operation is performed are not associated with each other in advance, and the recording control unit is configured to:

determine, at a predetermined timing, a first bank of the nonvolatile semiconductor memory in which data is written;

write data in a first physical block that belongs to the first bank when the first bank is not being used at the time of writing; and write data in a second physical block that belongs to a second bank that is different from the first bank when the first bank is being used at the time of writing.

17. The information processing apparatus according to claim 16, wherein the command analyzing unit causes one of a plurality of power management modes to operate in accordance with the received power management command, and causes the upper limit of the number of banks to be operated in parallel to be different in each of the power management modes.

18. The information processing apparatus according to claim 17, wherein the recording control unit causes a first power management mode, in which the upper limit of the number of banks to be operated in parallel is set to one, to operate when the analysis result by the command analyzing unit specifies a minimum power consumption, and the recording control unit causes a second power management mode, in which the upper limit of the number of banks to be operated in parallel is set to a maximum number of banks configured to operate in parallel simultaneously, to operate when the analysis result by the command analyzing unit does not specify a minimum power consumption.

19. The information processing apparatus according to claim 16, wherein the memory system further includes a buffer memory that temporarily stores therein data to be written in the nonvolatile semiconductor memory, and the recording control unit performs writing on the nonvolatile semiconductor memory from the buffer memory when the number of banks that are currently operated in parallel is less than the upper limit.

20. The information processing apparatus according to claim 19, wherein the recording control unit causes writing from the buffer memory to the nonvolatile semiconductor memory to keep waiting when the number of banks that are currently operated in parallel is equal to the upper limit.

* * * * *